(12) United States Patent
Von Ammon et al.

(10) Patent No.: US 7,708,830 B2
(45) Date of Patent: May 4, 2010

(54) METHOD AND DEVICE FOR THE PRODUCTION OF A SILICON SINGLE CRYSTAL, SILICON SINGLE CRYSTAL, AND SILICON SEMICONDUCTOR WAFERS WITH DETERMINED DEFECT DISTRIBUTIONS

(75) Inventors: Wilfried Von Ammon, Hochburg/Ach (AT); Janis Virbulis, Babites pag. (LT); Martin Weber, Kastl (DE); Thomas Wetzel, Haiming (DE); Herbert Schmidt, Halsbach (DE)

(73) Assignee: Siltronic AG, Munich (DE)

( * ) Notice: Subject to any disclaimer, the term of this patent is extended or adjusted under 35 U.S.C. 154(b) by 534 days.

(21) Appl. No.: 11/513,701

(22) Filed: Aug. 31, 2006

(65) Prior Publication Data
US 2006/0292890 A1    Dec. 28, 2006

Related U.S. Application Data

(62) Division of application No. 10/809,070, filed on Mar. 25, 2004, now abandoned.

(30) Foreign Application Priority Data

Mar. 27, 2003   (DE) ................ 103 13 940
Aug. 28, 2003   (DE) ................ 103 39 792

(51) Int. Cl.
*C30B 15/10* (2006.01)
(52) U.S. Cl. .................. 117/13; 117/33; 117/35; 117/217
(58) Field of Classification Search .......... 117/13, 117/33, 35, 217
See application file for complete search history.

(56) References Cited

U.S. PATENT DOCUMENTS

| 3,551,115 A | 12/1970 | Jamieson et al. |
| 5,162,072 A | 11/1992 | Azad |
| 5,567,399 A | 10/1996 | Von Ammon et al. |
| 5,997,635 A | 12/1999 | Kubota et al. |

(Continued)

FOREIGN PATENT DOCUMENTS

EP    1 270 769 A1    1/2003

(Continued)

OTHER PUBLICATIONS

Patent Abstract of Japan corresponding to JP 2003-002782A.

(Continued)

*Primary Examiner*—Robert M Kunemund
(74) *Attorney, Agent, or Firm*—Brooks Kushman P.C.

(57) ABSTRACT

A method for the production of a silicon single crystal by pulling the single crystal, according to the Czochralski method, from a melt which is held in a rotating crucible, the single crystal growing at a growth front, heat being deliberately supplied to the center of the growth front by a heat flux directed at the growth front. The method produces a silicon single crystal with an oxygen content of from $4*10^{17}$ cm$^{-3}$ to $7.2*10^{17}$ cm$^{-3}$ and a radial concentration change for boron or phosphorus of less than 5%, which has no agglomerated self-point defects. Semiconductor wafers are separated from the single crystal. These semiconductor wafers have may have agglomerated vacancy defects (COPs) as the only self-point defect type or may have certain other defect distributions.

18 Claims, 15 Drawing Sheets

U.S. PATENT DOCUMENTS

| | | | |
|---|---|---|---|
| 6,086,671 A * | 7/2000 | Kawanishi et al. | 117/30 |
| 6,113,688 A | 9/2000 | Kawanishi et al. | |
| 6,153,008 A | 11/2000 | Von Ammon et al. | |
| 6,190,631 B1 | 2/2001 | Falster et al. | |
| 6,299,982 B1 | 10/2001 | Tamatsuka et al. | |
| 6,413,310 B1 | 7/2002 | Tamatsuka et al. | |
| 6,416,836 B1 | 7/2002 | Falster et al. | |
| 6,569,535 B2 | 5/2003 | Murakami et al. | |
| 6,869,478 B2 | 3/2005 | Nakamura et al. | |
| 7,235,133 B2 * | 6/2007 | Kimura | 117/213 |
| 2001/0047749 A1 | 12/2001 | Watanabe et al. | |
| 2002/0048670 A1 | 4/2002 | Lee et al. | |
| 2002/0081440 A1 | 6/2002 | Murakami et al. | |
| 2002/0092461 A1 | 7/2002 | Virbulis et al. | |
| 2003/0106485 A1 * | 6/2003 | Kononchuk et al. | 117/30 |
| 2003/0172865 A1 | 9/2003 | Lida | |

FOREIGN PATENT DOCUMENTS

| | | |
|---|---|---|
| JP | 61178490 A | 11/1986 |
| JP | 04016591 A | 1/1992 |
| JP | 2001199793 A | 7/2001 |
| JP | 2001-261495 A | 9/2001 |
| JP | 2002249396 A | 9/2002 |
| JP | 2004-143002 A | 5/2004 |
| KR | 2000-005835 | 1/2000 |

OTHER PUBLICATIONS

Patent Abstract of Japan corresponding to JP 05-294782 A.
Zulehner/Huber in Crystals 8, Springer Verlag., Berlin Heidelberg, 1982, pp. 44-46.
Journal of Crystal Growth, 230 (2001), pp. 92-99.
Ammon. Journal of Crystal Growth, 151, 1995, pp. 273-277.
Eidenzon/Puzanov in Inorganic Materials, vol. 33, No. 3, 1997, pp. 219-255.
H. Bender, J. Vanhellemont, R. Schmolke, Japan. F. Appl. Phys. 36 (1997), L1217-L1220, Part 2, No. 9 A/B.
English Abstract corresponding to JP 2004-143002.
English Abstract corresponding to JP 2001199793.
English Abstract corresponding to JP 2002249396.
U.S. Patent No. 6,869,478 is the English equivalent to JP 2001-261495.

* cited by examiner

METHOD AND DEVICE FOR THE PRODUCTION OF A SILICON SINGLE CRYSTAL, SILICON SINGLE CRYSTAL, AND SILICON SEMICONDUCTOR WAFERS WITH DETERMINED DEFECT DISTRIBUTIONS

CROSS-REFERENCE TO RELATED APPLICATION

This application is a division of and claims priority to U.S. application Ser. No. 10/809,070 filed Mar. 25, 2004 now abandoned, and also claims priority to German applications DE 103 13 940.0 filed Mar. 27, 2003 and DE 103 39 792.2 filed Aug. 28, 2003.

BACKGROUND OF THE INVENTION

1. Field of the Invention

The invention relates to a method for the production of a silicon single crystal by pulling the single crystal, according to the Czochralski method, from a melt which is held in a rotating crucible, with the single crystal growing at a growth front. The invention also relates to a silicon single crystal and to semiconductor wafers which are separated therefrom.

2. The Prior Art

The production of single crystals which have a diameter of 200 mm or more represents a significant challenge, particularly since it is very difficult to deliberately adjust the radial crystal properties within a very narrow tolerance range. This applies to the concentration of impurities or dopants, and especially to the crystal defects and self-point defects, and agglomerates thereof. Self-point defects include interstitial silicon atoms (silicon self-interstitials) and vacancies, which are formed at the growth front of the single crystal. They very substantially determine the radial and axial defect distributions occurring later in the single crystal, and they also affect the impurity distributions which occur. For example, vacancies contribute to the precipitation of oxygen. When they exceed a size of about 70 nm, oxygen precipitates form oxygen-induced stacking faults (OSFs). The vacancies themselves can combine into agglomerates and form so-called COPs (crystal originated particles). Agglomerates of interstitial atoms form local crystal dislocations, which are also referred to as LPITs (large etch pits) because of the detection method which is used. The oxygen concentrations and the thermal conditions at the growth front and in the solidifying single crystal determine the nature and distribution of the crystal defects and impurities.

The thermal conditions when pulling the single crystal are dictated by the heat sources, i.e. the heating elements which are used, and the heat of crystallization released during solidification. The heat energy is transferred to the single crystal by radiation, heat conduction and heat transport, for example via the flows in the melt. The removal of heat in the vicinity of the growth front is determined to a large extent by the heat radiated from the edge of the single crystal and by the thermal dissipation in the single crystal. Overall, the thermal budget can be affected by the design of the pulling system, i.e. via the geometrical arrangement of the thermally conductive parts, the heat shields and by additional heat sources. The process conditions, for example growth rate, pressure, quantity, type and flow of inert gases through the pulling system furthermore contribute substantially to the thermal balance. Increasing the pressure or the quantity of inert gases, for example, will reduce the temperature. Faster pull rates produce more heat of crystallization.

The flows which transport heat in the melt are extremely difficult to predict. The heating elements, generally arranged in a ring around the crucible, produce a convective flow in the melt. Together with the counter-rotation conventionally used for the single crystal and crucible, this leads to pattern of movement in the melt which is distinguished by an upward melt flow at the edge of the crucible and a downward melt flow below the growing single crystal.

As experiments have shown, the movement of the melt also depends on the degree and direction of the rotation of the crucible and the single crystal. For example, iso-rotation and counter-rotation produce very different convection patterns. Crystal pulling with iso-rotation has already been studied (Zulehner/Huber in Crystals 8, Springer Verlag, Berlin Heidelberg 1982, pp 44-46). Counter-rotation is generally preferred because, compared to iso-rotation, it leads to a less oxygen-rich material and significantly more stable conditions for the crystal growth. The iso-rotation variant is not generally used on an industrial scale.

The flows which transport heat and oxygen in the melt can also be affected by the forces due to applied electromagnetic fields. Static or dynamic fields make it possible to alter the degree and direction of the flows in the melt, so that different oxygen contents can be obtained. They are primarily used for oxygen control. Magnetic fields are used in a number of variants, for example in the form of static magnetic fields (horizontal, vertical and CUSP magnetic fields), single-phase or polyphase alternating fields, rotating magnetic fields and traveling magnetic fields. According to U.S. Patent Application No. 2002/0092461 A1, for example, a traveling magnetic field is used in order to control the incorporation of oxygen into the single crystal. Recent numerical simulations for the effect of magnetic fields on the movement of the melt are presented, for example, in "Numerical investigation of silicon melt flow in large diameter CZ-crystal growth under the influence of steady and dynamic magnetic fields", Journal of Crystal Growth, 230 (2001) 92-99.

The radial temperature distribution at the growth front of the crystal is extremely important for the crystal properties. It is determined essentially by the heat radiated from the edge of the single crystal. As a rule, a much more pronounced temperature drop is therefore observed at the edge of the single crystal than at its center. The axial temperature drop is usually denoted by G (axial temperature gradient). Its radial variation G(r) very substantially determines the self-point defect distribution, and therefore the other crystal properties as well. The radial change of the temperature gradient G due to the thermal budget is generally determined by numerical simulation calculations. The radial variation of the temperature gradient can be experimentally determined from the behavior of the radial crystal defect distribution for different growth rates.

The ratio V/G(r) is of crucial importance in terms of the creation of crystal defects, G(r) being the axial temperature gradient at the growth front of the single crystal and depending on the radial position (the radius r) in the single crystal, and V being the rate at which the single crystal is pulled from the melt. If the ratio V/G is more than a critical value k1, then vacancy defects (vacancies) predominantly occur; these can agglomerate and then be identified, for example, as COPs (crystal originated particles). Depending on the detection method, they are sometimes referred to as LPDs (light point defects) or LLSs (localized light scatterers). Because of the usually decreasing radial profile of V/G, the largest COPs most commonly occur at the center of the crystal. They generally have a diameter of about 100 nm, and therefore cause problems for component fabrication. The size and number of the COPs is determined by the initial concentrations of the vacancies, the cooling rate and the presence of impurities during agglomeration. For example, the presence of nitrogen leads to a shift of the size distribution toward smaller COPs with a larger defect density.

If the ratio V/G is lower than a critical value k2, which is less than k1, then self-point defects are predominantly found in the form of interstitial atoms (silicon self-interstitials), which can also produce agglomerates and are microscopically seen as dislocation loops. These are often referred to as A swirls, and the smaller form as B swirls, or as LPIT defects (large etch pits) for short because of their appearance. The size of LPITs lies in the range up to 10 µm. As a rule, not even epitaxial layers can cover up these defects perfectly. These defects as well can also impair the functionality of the electronic components fabricated on silicon wafers.

In the broadest sense, the region in which neither agglomeration of vacancies nor agglomeration of interstitial atoms takes place, i.e. in which V/G lies between k1 and k2, is referred to as a neutral zone or perfect region. The value of V/G at which the crystal changes from excess vacancies to excess interstitials naturally lies between k1 and k2, and is given in the literature as the critical limit $C_{crit}=1.3*10^{-3}$ cm$^2$ min$^{-1}$ K$^{-1}$ (Ammon, Journal of Crystal Growth, 151, 1995, 273-277). In a more specific sense, however, distinction is also made between a region in which there are still free unagglomerated vacancies and a particular region of free interstitial atoms. The vacancy region, also referred to as the v region (vacancies), is distinguished in that if the oxygen content of the single crystal is high enough, oxidation-induced stacking faults are created there, while the I region (interstitials) remains fully fault-free. In this more specific sense, therefore, only the I region is actually a perfect crystal region.

Large ingrown oxygen precipitates with a diameter of more than about 70 nm can be revealed as oxygen-induced stacking faults (OSFs). To this end, the semiconductor wafers cut from the single crystal are subjected to a special heat treatment, which is referred to as wet oxidation. The growth rate of the oxygen precipitates created during the crystal pulling, which are sometimes also referred to as grown BMDs (bulk microdefects), is promoted by vacancies in the silicon lattice. OSFs are therefore encountered primarily in the v region.

The single crystal would be virtually defect-free if the pulling conditions can be adjusted so that the radial profile of the defect function V/G® lies within the critical limits for COP or LPIT formation. This is not easy to achieve, however, especially when single crystals with a comparatively large diameter are being pulled, because the value of G then depends significantly on the radial position r. In general, owing to the radiative heat losses, the temperature gradient G is very much greater at the edge of the single crystal than at the center.

The radial profile of the defect function V/G®, or of the temperature gradient G®, can lead to there being several defect regions on a semiconductor wafer cut from a single crystal. COPS preferentially occur at the center. The size distribution of the agglomerated vacancies is dictated by the cooling rate of the single crystal in the vicinity of the growth front. The size distribution of the COPs can be altered from a few large COPs to many small, less perturbing COPs by a high cooling rate (more than 2 K/min), or short dwell times in the temperature range from the melting point to about 1100° C., or by doping the melt with nitrogen. Furthermore, a radial size distribution such that smaller defects are formed with increasing radius is found in the COP region. The COP region is followed by an oxygen-induced stacking fault ring (OSF), due to the interaction of vacancies and oxygen precipitates. Outside this is a fully defect-free region, which is in turn bounded by a region with crystal defects consisting of interstitial agglomerates (LPITs). At the edge of the single crystal, the interstitial atoms diffuse as a function of the thermal conditions, so that a centimeter-wide defect-free ring may also be created there.

The crystal defect regions that occur have already been discussed at length, in relation to the radial V/G profile, by Eidenzon/Puzanov in Inorganic Materials, vol. 33, No. 3, 1997, pp 219-255. This article has already indicated possible ways of producing defect-free material. Both the cooling rate in temperature range during agglomeration, the effect of nitrogen doping and methods such as oscillating growth rate are referred to in this context.

To a certain extent, radial homogenization of V/G(r) can be achieved by using passive or active heat shields in the vicinity of the solidification front, as proposed for example in U.S. Pat. No. 6,153,008. Most publications relate to an effect on the cooling behavior due to modified heat shields. With the known prior art, however, sufficient radial V/G homogenization for the production of perfect silicon, especially with large crystal diameters, cannot be achieved in this way. By means of impurities, for example nitrogen or carbon, but also oxygen, the size and positioning of the defect distribution can be influenced so that the precipitation of impurities such as oxygen, can also be influenced. It is therefore of great importance to be able to deliberately produce and control both axial and radial impurity profiles.

SUMMARY OF THE INVENTION

It is an object of the present invention to provide a method which makes it possible to deliberately set up the defect distributions required by the customer in a single crystal, even with large crystal diameters, so that as many semiconductor wafers as possible can be obtained with the specified properties of the single crystal. Semiconductor wafers which have only COPs, especially those with a predetermined size and density distribution, and semiconductor wafers which have no agglomerates of self-point defects (perfect silicon), are of particular interest in this context. Nevertheless, semiconductor wafers with a stacking fault ring (ring wafers), with both self-point defect types or with only one self-point defect type, together with a predetermined oxygen concentration or particular oxygen precipitation, may be specified by the customer.

The invention relates to a method for the production of a silicon single crystal by pulling the single crystal, according to the Czochralski method from a melt which is held in a rotating crucible, the single crystal growing at a growth front, wherein heat is deliberately supplied to the center of the growth front by a heat flux directed at the growth front.

The invention also relates to a silicon single crystal with an oxygen content of from $4*10^{17}$ cm$^{-3}$ to $7.2*10^{17}$ cm$^{-3}$ and a radial concentration change for boron or phosphorus of less than 5%, which has no agglomerated self-point defects, and which is optionally doped with nitrogen and/or carbon. The radial variation of the oxygen concentration (ROV) is preferably at most 5%, particularly preferably at most 2%.

The invention also relates to silicon semiconductor wafers with agglomerated vacancy defects (COPs) as the only self-point defect type, these defects having a variation in their average diameter of less than 10% and being present on a circular surface of the semiconductor wafers, the diameter of the circular surface being at least 90% of the diameter of the semiconductor wafers.

Lastly, the invention also relates to semiconductor wafers with certain other defect distributions. When analyzing the pulling tests which were carried out, it was found that insufficient radial homogenization of the ratio V/G® is correlated with an inadequate heat supply from the melt to the center of the growth front. In the past, the importance of the heat supply from the melt for the production of perfect silicon was not understood. According to the present invention, it is recommended that heat be deliberately supplied to the center of the growth front so that, per unit time, more heat reaches the center of the growth front than the edge region of the growth front surrounding the center. This can be achieved by a heat source acting on the center of the growth front and/or by an upward melt flow at the center of the melt. Besides the importance of an axial heat flux directed at the growth front, it was also found that an isothermal temperature distribution in the melt, parallel to the growth front, in a region of up to 5 cm below the growing single crystal, is particularly advantageous for radial homogenization. Expressed in terms of an axial temperature gradient Gs® in the melt, a temperature distribution in which a radial variation of the temperature gradient in the melt is no more than 15% should be produced in a region with an extent of up to 5 cm below the growth front and at least 90% of the diameter of the single crystal. The radial variation of Gs® is preferably less than 10%, and particularly preferably less than 3%. The present invention therefore provides conditions suitable for deliberate defect control or for the production of perfect silicon.

Especially with a view to the production of perfect silicon, tests have shown that the method according to the invention is particularly tolerant with respect to fluctuations of the pull rate. For instance, it is possible to pull silicon single crystals with a diameter of at least 200 mm, which have no agglomerated point defects, even if the pull rate fluctuates by ±0.02 mm/min, particularly preferably ±0.025 mm/min or more, the fluctuation range referring to a single crystal of at least 30 mm. This fact increases the yield significantly, without the need to provide additional error-prone regulatory means to control the pull rate.

According to one embodiment of the invention, a heat flux directed at the center of the melt is produced in the form of an upward melt flow by iso-rotation of the crucible and the growing single crystal, the crucible being rotated with at least 10% of the rotational speed of the single crystal. Since the oxygen content of the single crystal is increased to technically inexpedient concentrations by this, however, it is preferable to counteract the incorporation of oxygen into the crystal lattice by applying a magnetic field. For example, traveling magnetic fields (TMFs) which produce an upward or downward flow parallel to the crucible wall, or static CUSP fields which cause a reduction of the melt movement in the vicinity of the crucible edge, are suitable for this. With these magnetic fields, the oxygen content can be reduced to less than $6.0*10^{17}$ cm$^{-3}$ and the growth conditions can simultaneously be stabilized. Currents of up to 3000 A with up to 50 coil turns are preferably used to generate the required magnetic fields.

According to another embodiment of the invention, a heat flux directed at the center of the growth front may also be produced by a heat source which deliberately increases the temperature at the center of the bottom of the crucible compared with a temperature at the edge of the bottom. The temperature of the crucible is higher at the center of the crucible bottom, i.e. in the region above which the center of the growth front of the single crystal lies, by at least 2 K, preferably at least 5 K and particularly preferably at least 10 K, than the temperature at the edge of the crucible bottom. One embodiment of the invention therefore provides for the use of a heating resistor which is fitted at the center of the crucible bottom, or on the crucible shaft under the center of the crucible bottom. Instead of a heating resistor, it is also possible to use an induction coil which is operated at medium to high frequency (50 Hz to 500 Hz). The electromagnetic forces due to the coil drive an upward flow directed at the center of the growth front. The melt is also heated from the center of the crucible bottom. Depending on the geometrical arrangement, heating powers in the range of from 1 kW to 60 kW, will be required.

According to another embodiment of the invention, a bottom heater, which is conventionally present in pulling systems for the production of single crystals with diameters of at least 200 mm, is used for deliberately heating the melt from the center of the crucible bottom, thermal insulation being used to ensure that the bottom heater heats the center of the crucible bottom more strongly than the edge of the crucible bottom. To this end, a concentric gap filled with thermally insulating material is provided in an outer region of the baseplate and/or the outer crucible, so that the quartz crucible is thermally insulated more strongly in the outer region. The baseplate carries the crucible and a graphite outer crucible surrounding the latter. When heating is carried out with the bottom heater, therefore, heat is supplied to the melt essentially only at the center of the quartz-crucible bottom because of the annular thermal insulation in the baseplate or the outer crucible. For example, graphite sheets or graphite felts are suitable as an insulator material for filling the gap in the baseplate and/or in the outer crucible. The necessary bottom heater power is preferably in the range of from 20 kW to 80 kW, which is higher than the conventional powers. Thermal insulation may also be integrated into the crucible shaft, so as to minimize the downward thermal dissipation via the crucible shaft.

Another embodiment according to the invention for deliberately supplying heat to the center of the growth front consists in fitting a heat source below the center of the crystal growing in the melt. This may be done using an electrically operated graphite heating element embedded in quartz, or by means of a heating element which is protected from the melt by using other process-compatible materials.

According to another embodiment of the invention, a heat flux directed at the center of the growth front is produced by an electromagnetic field, to which the melt is exposed and which is partially shielded by shielding at least 10% of the area of a wall of the crucible against an effect of the electromagnetic field on the melt. A particularly preferred way of producing such a heat flux consists in using a traveling magnetic field. The forces due to the field depend on the material of the shielding and on the amplitude and frequency of the electric current which flows through the coils producing the magnetic field. Metallic materials may be used as magnetic shielding, for example copper plates with a thickness in the centimeter range, which are arranged between the magnetic coils and the crucible, and which hence remove some of the area of the crucible wall and the melt lying behind it from the effect of the magnetic field. Shielding which consists of two mutually opposed plates, each with a vertex angle of 90°, has proved particularly effective. Frequencies of from 10 Hz to about 1000 Hz are preferably used. A frequency range of from 30 Hz to 100 Hz is particularly suitable when using a traveling magnetic field with partial shielding in the form of rectangular copper plates. Currents of up to 500 A with up to 50 coil turns are preferably used to produce such a traveling field. Fast crucible rotations of at least 3 rpm reduce the effect of the magnetic field, so that the intended supply of additional heat to the growth front can be influenced by the speed of the crucible rotation. The amount of melt respectively present in the crucible should furthermore be taken into account, since different melt flow patterns may be formed as a function of this. The necessary conditions, i.e. the ratio of magnetic field, shielding and pulling process parameters, for example the crucible rotation, will each be determined roughly by experiments and approximate simulation calculations, as a function of the amount of melt present in each case.

The aforementioned embodiments of the invention may be combined with measures which are already known and which are suitable for homogenizing the axial temperature gradient $G(r)$. Preferred combinations are ones in which heat is additionally supplied to the phase boundary, which is formed by the growing single crystal, the atmosphere surrounding it, and the melt. This may, for example, be done by using a heat shield described in U.S. Pat. No. 6,153,008. It is particularly preferable to use a heating element on the lower edge of the heat shield, which is described in that patent application. A cooler acting on the single crystal may furthermore be fitted over the heating element, as described for example in U.S. Pat. No. 5,567,399. This makes it possible to increase the pull rate and to further adjust the radial homogenization of $G(\circledR)$. The accelerated cooling associated with this furthermore makes the remaining COPs significantly smaller. The size of these COPs can thereby be brought below a critical value, below which these defects no longer have any effect on the component function.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views.

DETAILED DESCRIPTION OF THE PREFERRED EMBODIMENT

Figure 1:
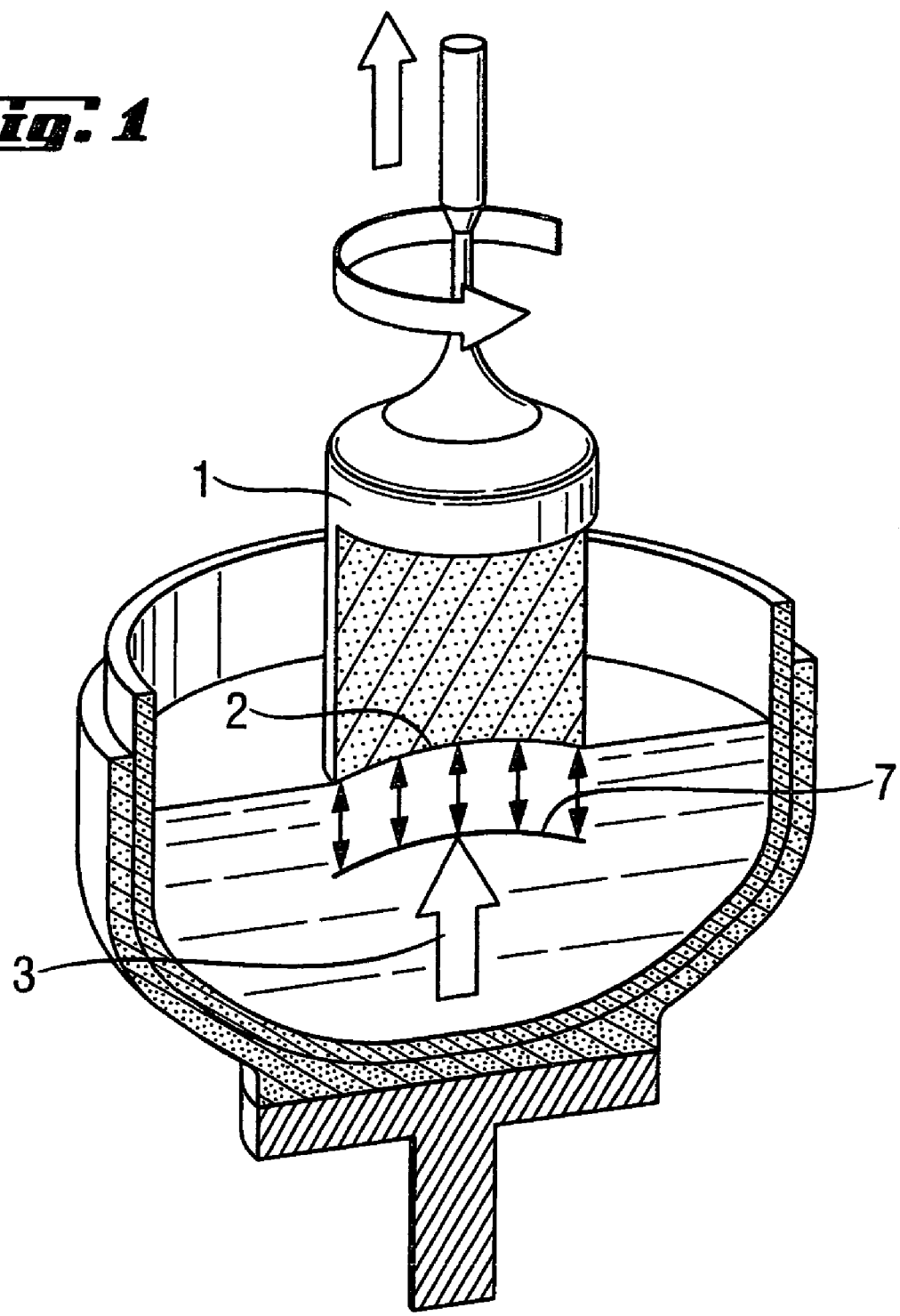
FIG. 1 schematically represents the principle of the method according to the invention.

Referring now in detail to the drawings, FIG. 1 schematically represents the principle of the method according to the invention. The single crystal 1 is growing at a growth front 2, to the center of which a heat flux 3 is deliberately supplied through the melt. With the aid of the additional axial heat supply indicated, it is possible to carry out homogenization of the radial temperature gradient $G(\circledR)$ at the growth front which is sufficient for the production of perfect silicon, or to set up a temperature gradient $G(\circledR)$ required for deliberate defect control, for single crystals with large diameters of at least 200 mm. The quality of the homogenization of $G(\circledR)$ is dictated by the temperature distribution in the melt. It is particularly preferable for the axial temperature gradient $Gs(\circledR)$ set up in the melt to have the smallest possible radial variation in the melt, so as to obtain the indicated isothermal temperature distribution 7 parallel to the growth front.

Figure 2:
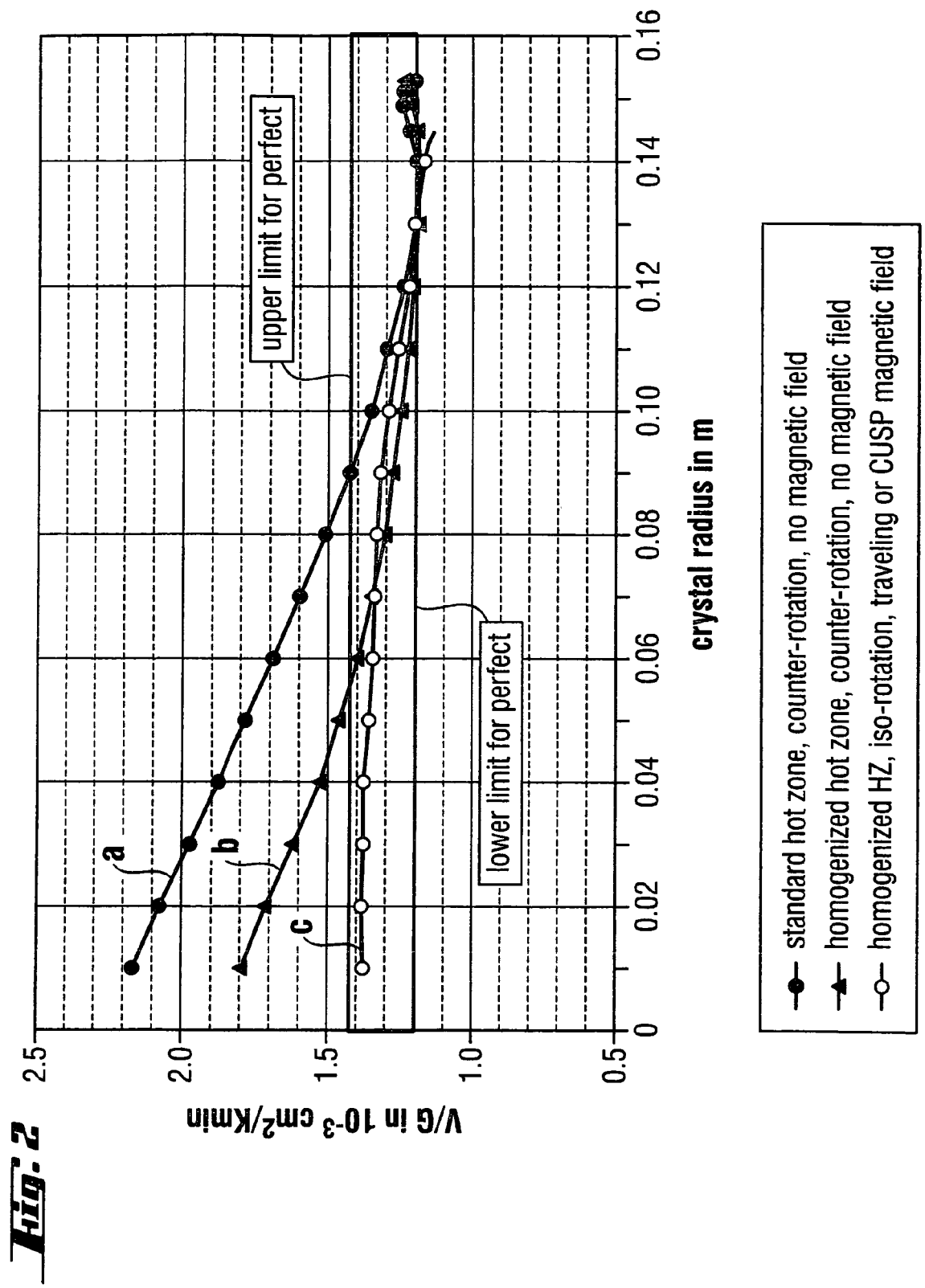
FIG. 2 shows profiles of the ratio $V/G(\circledR)$ as a function of the radius of the single crystal.

The effectiveness of the method according to the invention is demonstrated by the profiles represented in FIG. 2 for the ratio $V/G(\circledR)$ as a function of the radius of the single crystal, for single crystals with a diameter of 300 mm. The thermal flow in the melt toward the center of the growth front, which is obtained with iso-rotation of the single crystal and the crucible according to the invention, leads to a very significant radial homogenization of $V/G(\circledR)$, shown as curve (c), while attempted homogenization by means of heat protection shields according to different designs (a) and (b), which are not in accordance with the invention, are not sufficient for the production of perfect silicon. The subsequent figures contrast the effect of the central heat flux according to the invention (FIG. 5 and FIG. 6) compared with conventional melt convection (FIG. 3 and FIG. 4) in the form of results from model calculations.

Figure 3:
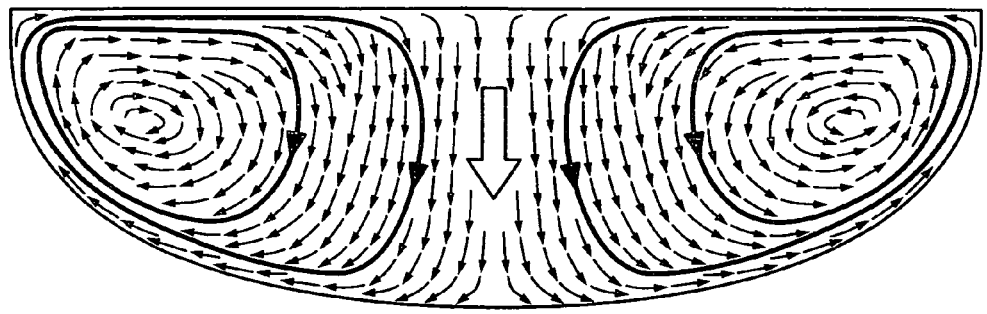
FIG. 3 shows the typical melt flows occurring in the conventional Czochralski method (with counter-rotation of the single crystal and the crucible)
Figure 4:
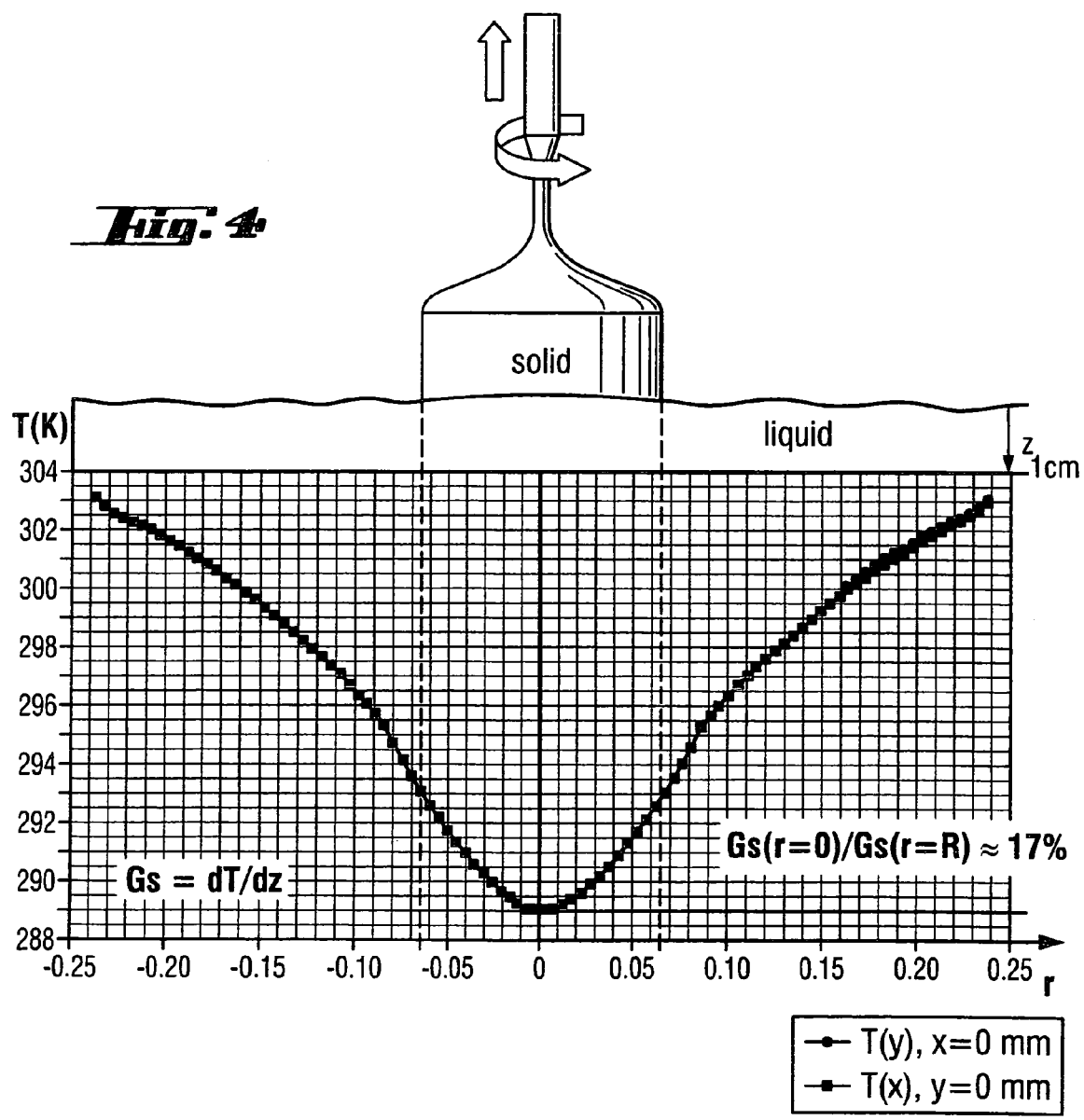
FIG. 4 shows the profile typically resulting therefrom for the axial temperature gradient $Gs(\circledR)$ in the melt.

FIG. 3 shows the typical melt flows occurring in the conventional Czochralski method (with counter-rotation of the single crystal and the crucible), which are distinguished by an axial flow directed downward at the crucible bottom. In this case, the temperature conditions represented in FIG. 4 are obtained at a few centimeters below the growth front. $Gs(\circledR)$ exhibits a pronounced change as a function of the radius. The radial change of $Gs(\circledR)$ within the crystal diameter is about 17%.

Figure 5:
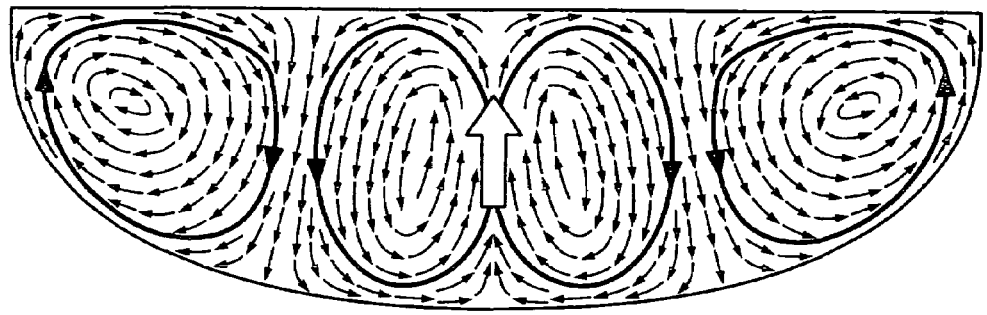
FIGS. 5 and 6 respectively show melt flow patterns and the profile of the axial temperature gradient $Gs(\circledR)$ as are encountered when carrying out the method according to the invention.
Figure 6:
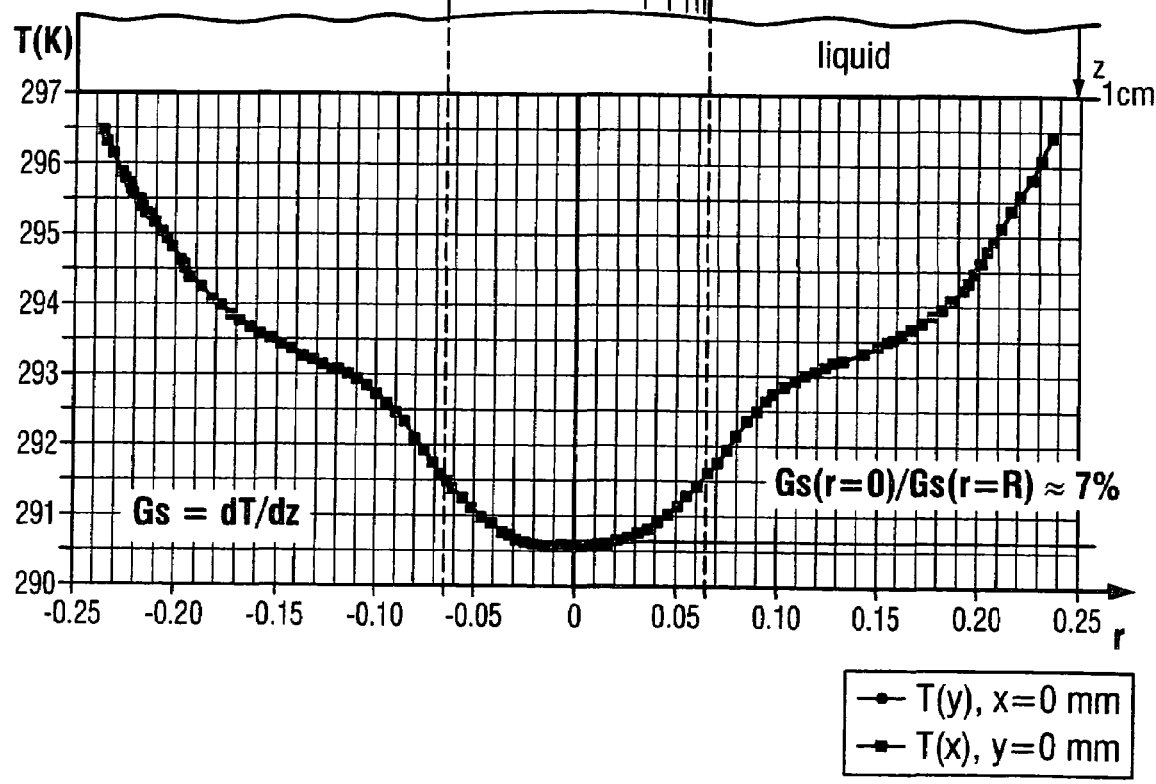

The conditions are significantly different when carrying out the method according to the invention, for example according to the embodiment in which the melt is exposed to an asymmetric traveling field generated by means of two shields, which shield at least 10% of the wall area of the crucible. The melt flow patterns represented in FIG. 5 show an axial melt flow directed at the growth front. The heat transport due to the melt flow leads to a significantly different temperature distribution in the melt below the growing single crystal (FIG. 6) compared with FIG. 4. A significantly more homogeneous temperature gradient $Gs(\circledR)$ is found in the melt, which provides the desired axial homogenization of self-point defects and impurities and dopants in the single crystal. The radial variation of $Gs(\circledR)$ is less than 15% in a silicon melt. For the conditions on which FIG. 6 is based, 0.7% was determined on average.

The subsequent figures, FIG. 7 to FIG. 13, represent various arrangements of preferred embodiments of the invention. Heating elements play a central role in FIG. 7 to FIG. 10; these may be designed as electrical heating resistors, induction heaters or possibly radiation heaters, and are arranged at respectively different positions below the growing single crystal. Each heating element functions as a heat source, which produces a heat flux directed at the center of the growth front of the single crystal. In order to reinforce the effect of the heating elements, thermally insulating elements 6, which may be graphite sheets or graphite felts, may be fitted in a ring below the quartz crucible, although not under the center of the crucible bottom. They impede off-axial supply of heat to the melt. In order to focus the heating effect in the melt flow directed at the center of the growth front, elements with high or extremely high thermal conductivity, for example made of graphite or other process-compatible materials, may be incorporated at the center of the crucible bottom. The energy supplied by means of the heating elements is in each case adapted to the geometrical and process-related situation, and must for example be readjusted according to the residual amount of melt in the crucible, which decreases as the crystal grows.

Figure 7:
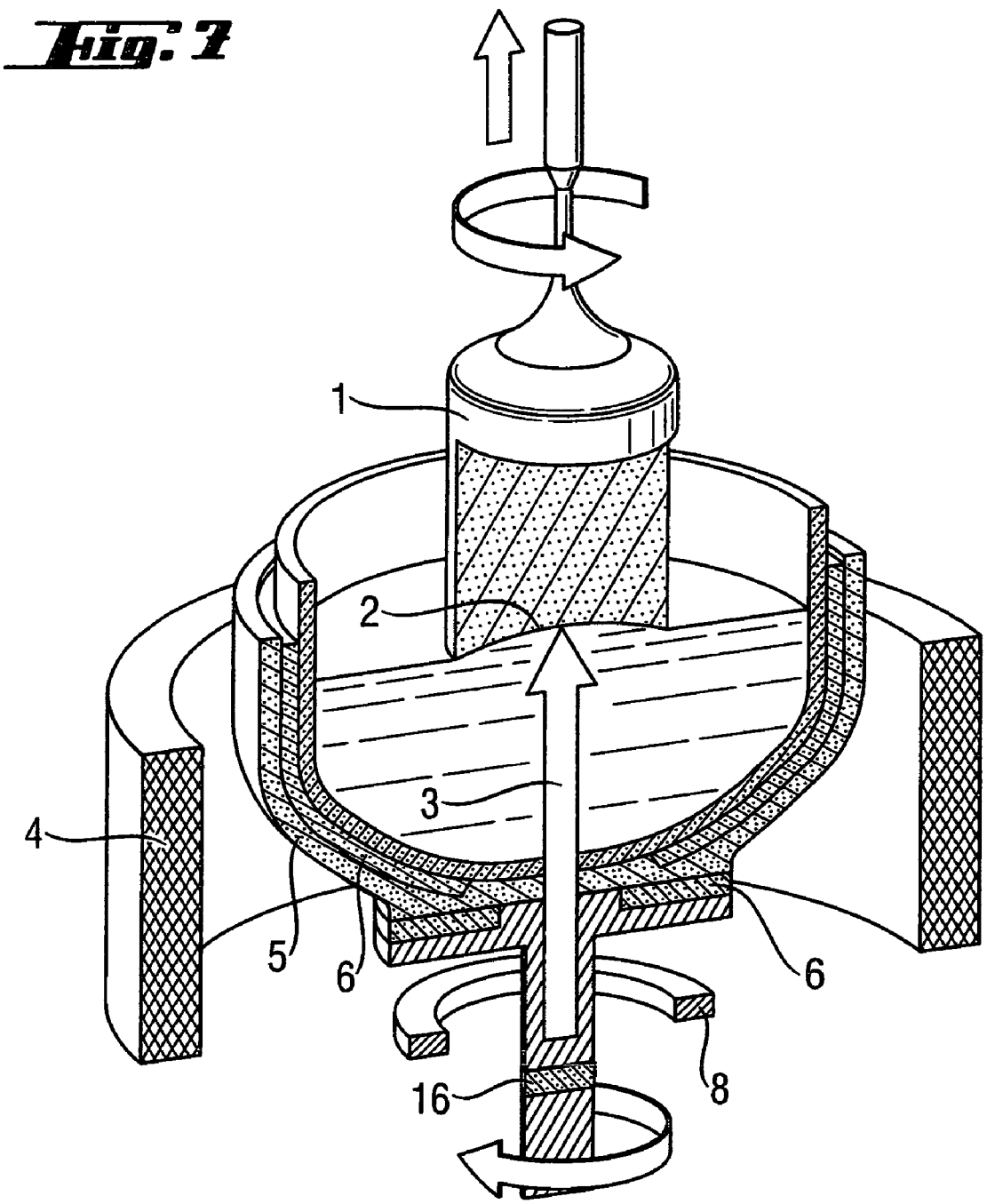
FIGS. 7 to 13 show various arrangements of preferred embodiments of the invention.

FIG. 7 schematically shows the arrangement which, in addition to a conventional main heater 4, has an additional heating element 8 which is arranged as a crucible bottom heater below the graphite outer crucible 5 and produces a heat flux 3 directed upward at the center of the growth front 2 of the single crystal 1 by means of the thermal insulation 6. The thermal insulation 6 may be integrated in the outer crucible and/or the baseplate, which carries the outer crucible. The heating power of the additional crucible bottom heater 8 should preferably be more than 2% of the heating power of the main heater, in order to produce an effective heat flux. The crucible bottom heater may, for example, be designed as an electrical heating resistor made of graphite, and may optionally be configured so that it can be translated. The necessary heating power must be adapted to the respective amount of melt (depending on the length of crystal that has already solidified). It is in the range of more than 5 kW.

Figure 8:
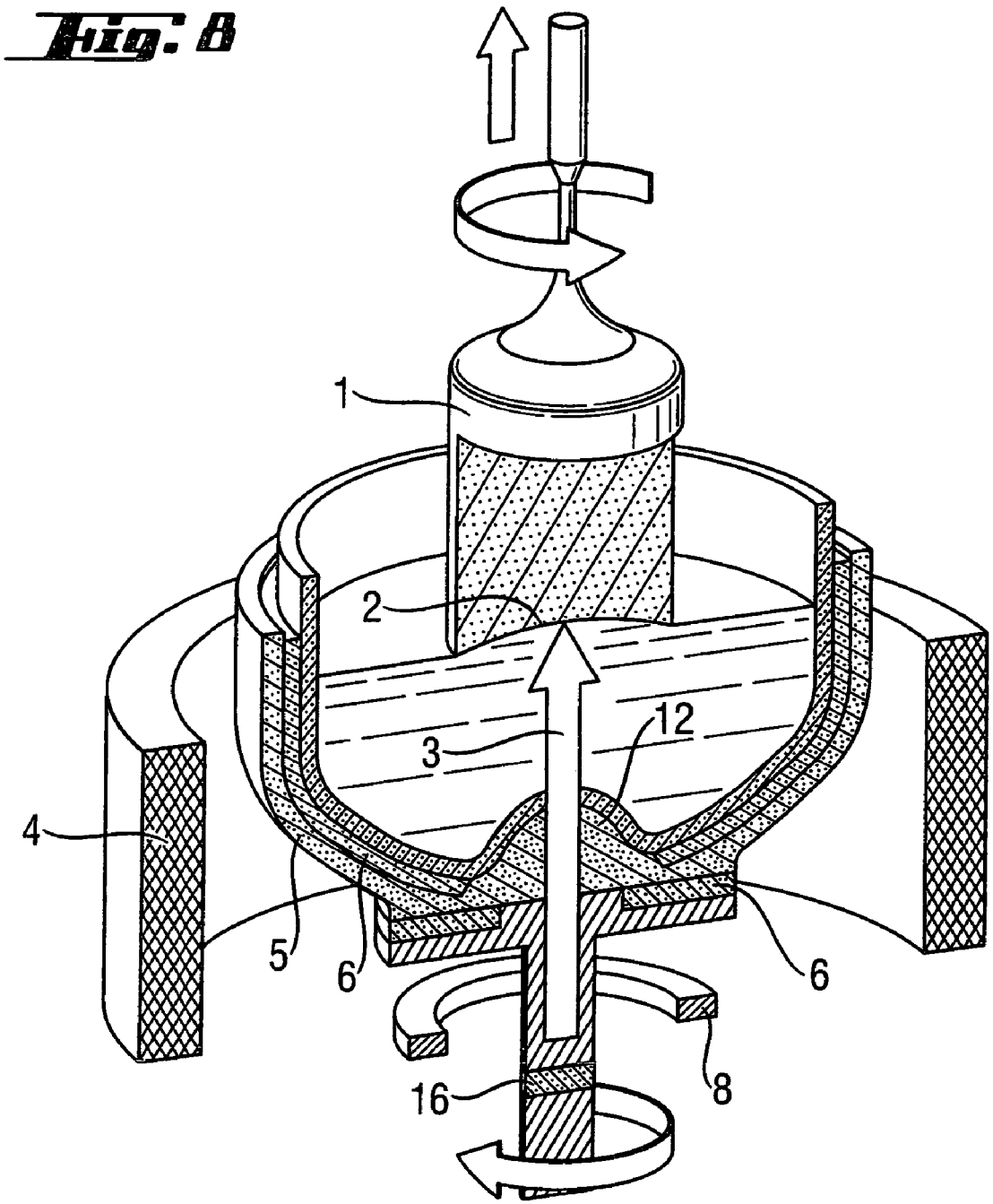

FIG. 8 represents other design features which lead to improved heat transfer at the crucible center. For instance, the central heat flux may be enhanced by means of an increased material base at the quartz-crucible center, for example by a central thickening 12 of the outer crucible. An insulating element 16 may be inserted in order to prevent thermal dissipation via the crucible shaft.

Figure 9:
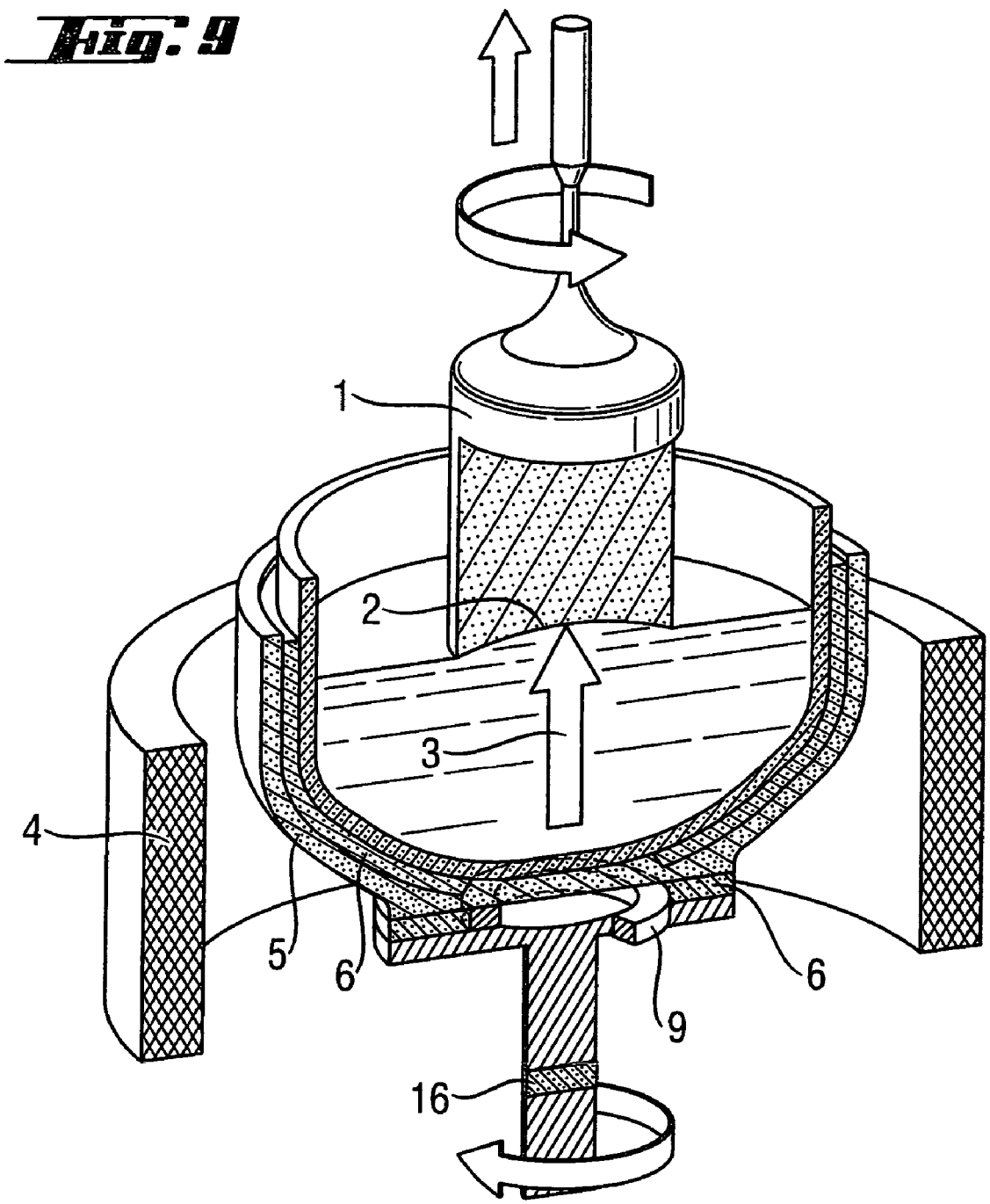

In the arrangement according to FIG. 9, an additional heating element 9 producing a heat flux is integrated at the bottom of the outer crucible 5. In this embodiment, it is possible to use either an inductively operated heating element or a resistive heating element, or a combination of the two.

Figure 10:
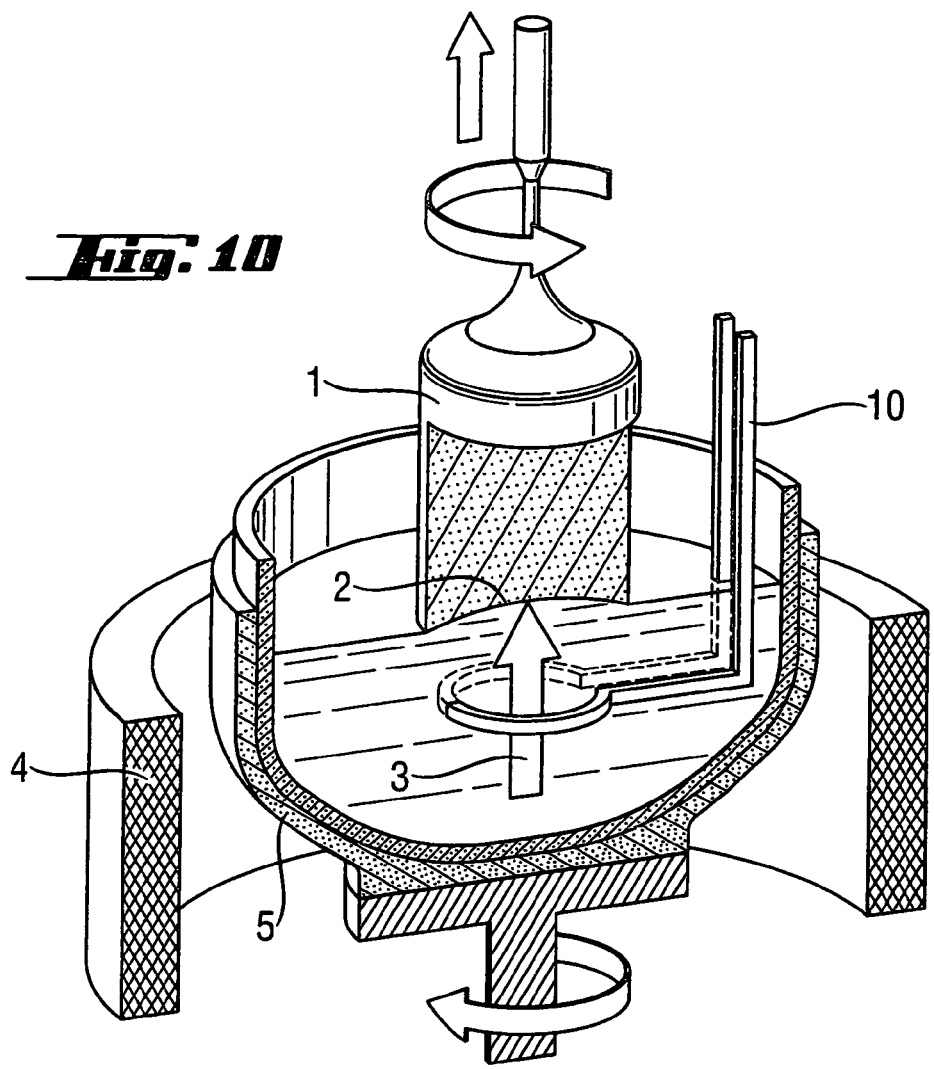
Figure 10A:
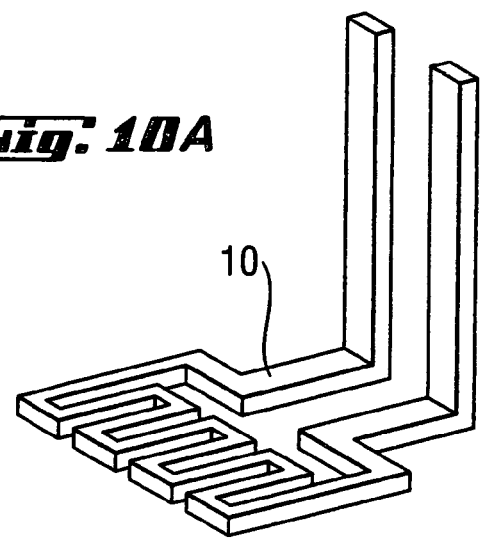

In the arrangement according to FIG. 10, the heat flux required according to the invention at the center of the growth front is produced by a heating element 10 arranged in the melt, below the growth front of the growing single crystal. To this end, for example, it is possible to use a quartz-clad graphite heater, for example a heater with the meandering structure of heating zones which is represented on an enlarged scale.

Figure 11:
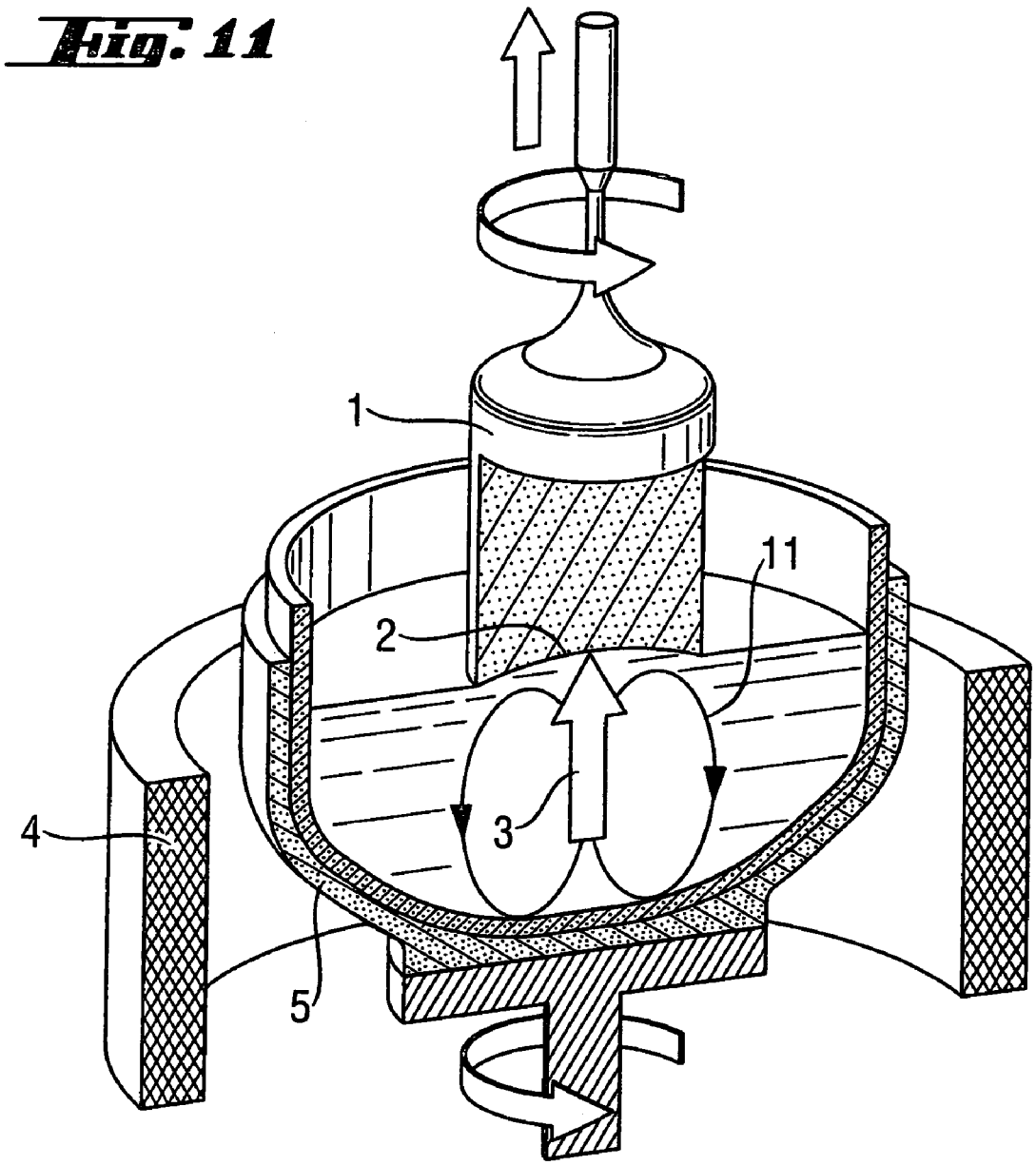

With an arrangement according to FIG. 11, an intended heat flux 3 directed at the center of the growth front is produced by iso-rotation of the single crystal and the crucible. To this end, the speed of the crucible rotation must be set to a value of at least 10% of the speed of the crystal rotation. A preferred flow pattern 11 is set up in the melt. During the pulling process, additional variations of the crucible or crystal rotation may be necessary in order to compensate for the varying thermal budget. The generally high oxygen contents in the melt due to the iso-rotation of the crucible and the single crystal can be reduced by magnetic fields acting on the melt primarily in the edge region of the crucible. Static, magnetic and CUSP fields are particularly expedient, and facilitate oxygen contents lower than $6.0*10^{17}$ cm$^{-3}$ in the melt without compromising the process conditions according to the method.

Figure 12:
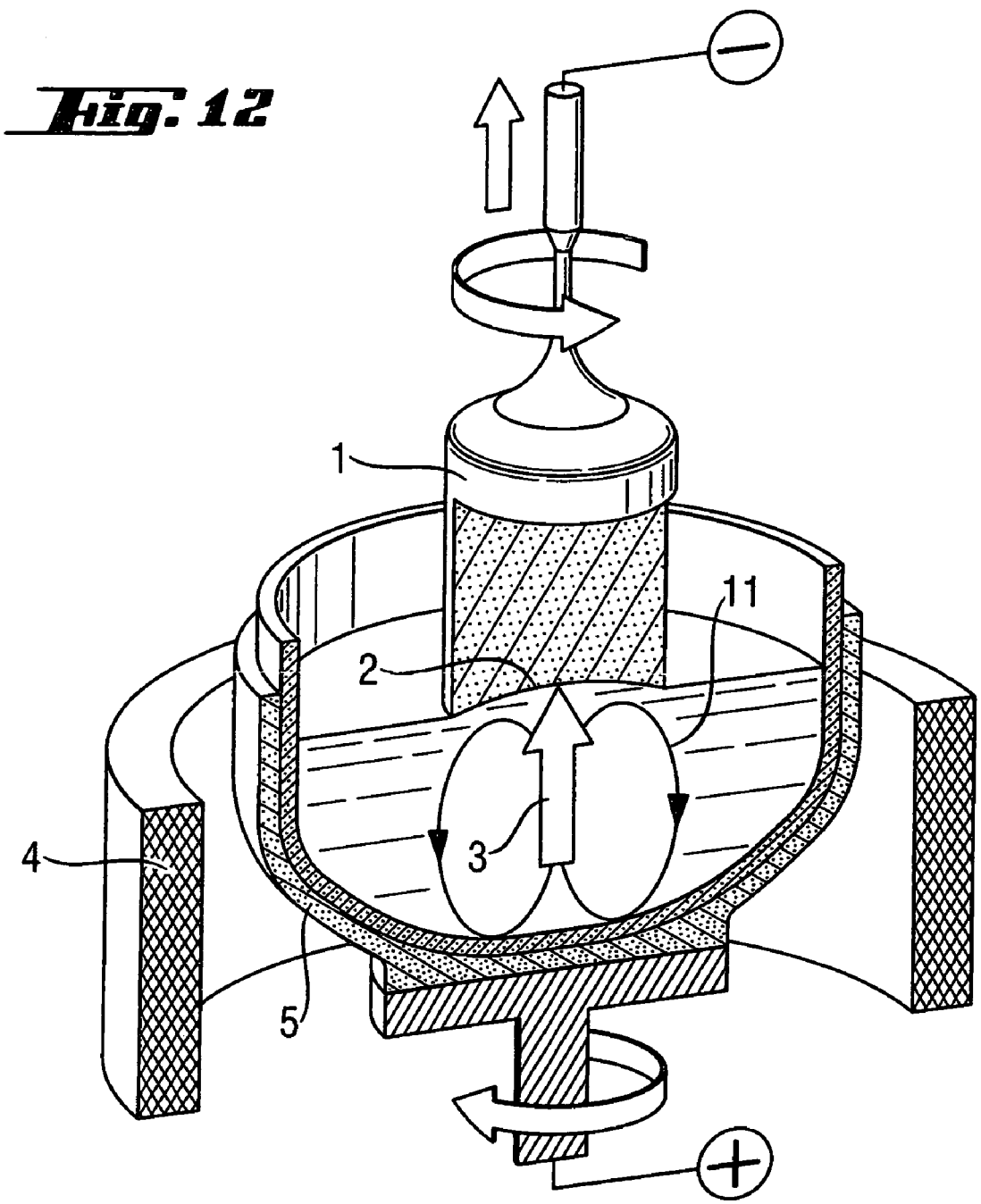

With an arrangement according to FIG. 12, an intended heat flux 3 directed at the center of the growth front is produced by a static electric field between the crucible and the single crystal. To this end, a positive voltage of more than 100 volts must be applied to the crucible. A preferred flow pattern 11 is set up in the melt.

Figure 13:
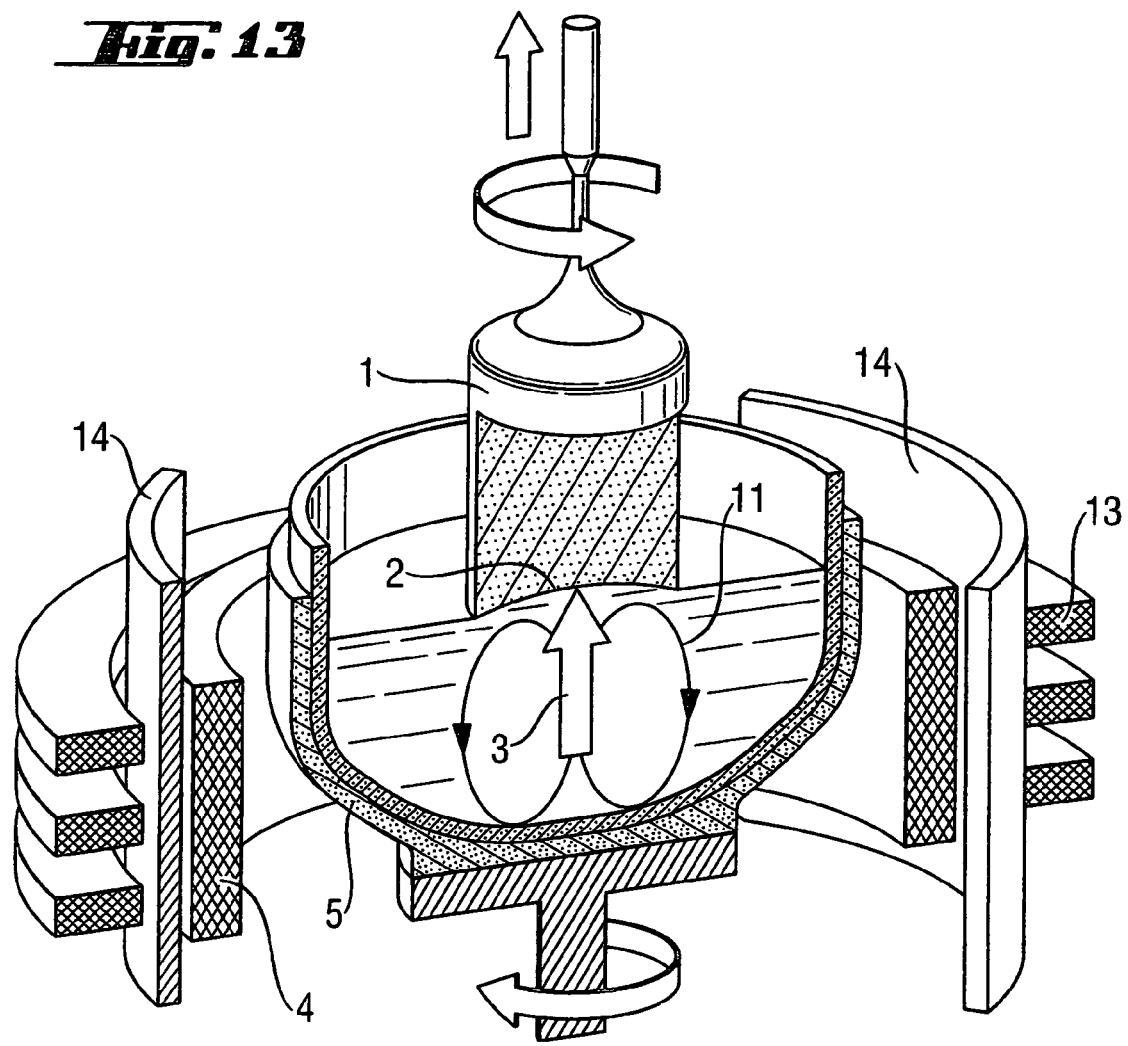

Other preferred embodiments according to the invention relate to the use of electromagnetic fields which produce a heat flux directed perpendicularly to the growth front due to the forces which they exert on the melt, the forces on the melt being limited by shielding at least 10% of the wall area of the crucible. The coils producing the magnetic field may be arranged outside or inside the crystal pulling system. A preferred embodiment of this type comprises a partially screened traveling magnetic field. FIG. 13 represents a suitable arrangement with a single crystal 1 growing at a growth front 2, a heat flux 3 produced by the effect of the traveling field and directed at the center of the growth front, and an annular heating element 4 arranged around the crucible. A preferred flow pattern 11 is set up in the melt. The traveling field is produced by a magnet 13, which is also arranged in a ring around the heating element 4. With a coil of up to 50 turns and a coil diameter of more than 500 mm, it has been found that electrical currents of from more than 100 A to 500 A are particularly suitable for producing the magnetic field. For partial shielding of the traveling magnetic field, there are two mutually opposed shields 14 fitted radially inside the magnetic coil, by which the rotational symmetry of the field is broken so that somewhat different conditions are formed in the direction of the shields than perpendicularly thereto. The shields preferably consist of copper and each have a vertex angle of 90°. They shield at least 10% of the wall area of the crucible.

Figure 14:
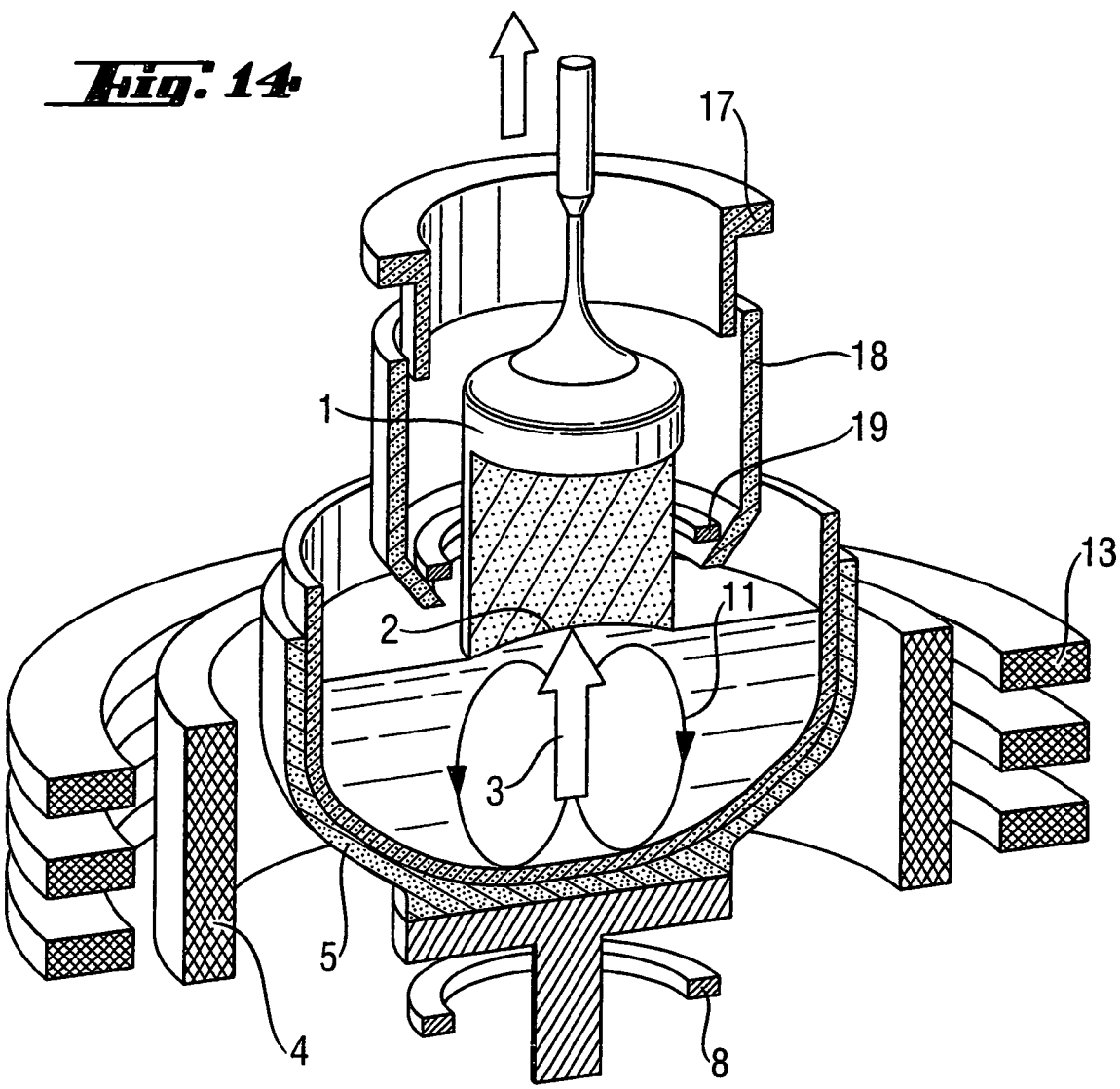
FIG. 14 shows an arrangement according to FIG. 11, in which a heating element and a cooling element are also provided.

As a particularly preferred embodiment of the invention, FIG. 14 shows the combination of the embodiment according to FIG. 11 with an additional heat source 19, with the aid of which additional heat is supplied to the phase boundary of the single crystal, to the atmosphere surrounding this and to the melt. The heat source 19 preferably comprises a heating resistor designed as a ring, which surrounds the single crystal 1 in the vicinity of the phase boundary. Powers of more than 5 kW are preferably delivered to the heat source 19, so that the temperature gradient G® at the phase boundary of the single crystal is homogenized. The heat source is connected via insulation to a conventional heat shield 18, which ensures sufficient shielding of the single crystal from the heat radiation of the melt, and thereby also influences the temperature distribution in the single crystal. To this end, heat shields geometrically shaped according to the requirements are used, which may consist of a plurality of layers of graphite, graphite felt, molybdenum or combinations thereof. An additional cooling device 17 is arranged above the heat source 19. The cooling device 17 provides a further way of adjusting the necessary temperature distribution. Furthermore, the cooling device increases the gradient G overall, which makes it possible to use a faster pull rate, for example more than 0.36 mm/min for perfect 300 mm crystals. Static or dynamic magnetic fields are produced in the melt by means of the magnetic coils 13 arranged around the crucible, so that the necessary melt flows transporting heat and oxygen can be set up accurately.

Of course, the present invention also covers other combinations of the described embodiments and features, even if such combinations have not been explicitly mentioned.

For instance, another preferred embodiment is based on the one represented in FIG. 14, but instead of the annular heater 19, it is equipped with features such as the partial thermal insulation 6 shown in FIG. 8 or the heating element 9 in the vicinity of the crucible bottom as disclosed in FIG. 9. This embodiment makes it possible to pull single crystals with a diameter of 300 mm or more at a comparatively fast pull rate of at least 0.6 mm/min, with the radial temperature gradient deviating by no more than 10% from the critical value $C_{crit}$. It is hence possible to produce single crystals with an increased output, the agglomerated self-point defects of which, due to their small size and composition, lead to no productivity losses in the fabrication process of the electronic components, or to significantly reduced productivity losses.

The particular uses of the invention will be presented below with reference to three examples, which relate to the production of silicon semiconductor wafers using a device according to FIG. 14.

The unagglomerated self-point defect regions were determined with the aid of a charge-carrier lifetime measurement (µPCD). To this end, for example, axial sections in the single crystal are smoothly etched, cleaned and heat-treated for 4 hours at 800° C. and 16 hours at 1000° C., and a lifetime measurement is carried out followed by image processing. The vacancy regions are thereby detectable, since there is a modified lifetime due to the oxygen precipitates which are formed.

Figure 15:
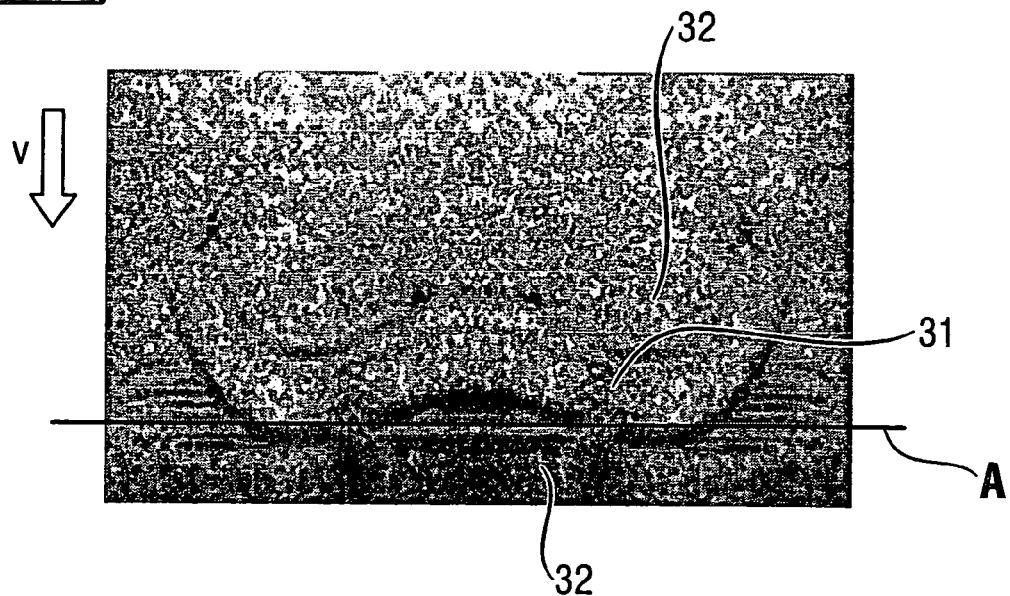
FIGS. 15 to 17 relate to examples according to the invention, and show the distribution of defect types on various crystal regions.
Figure 15A:
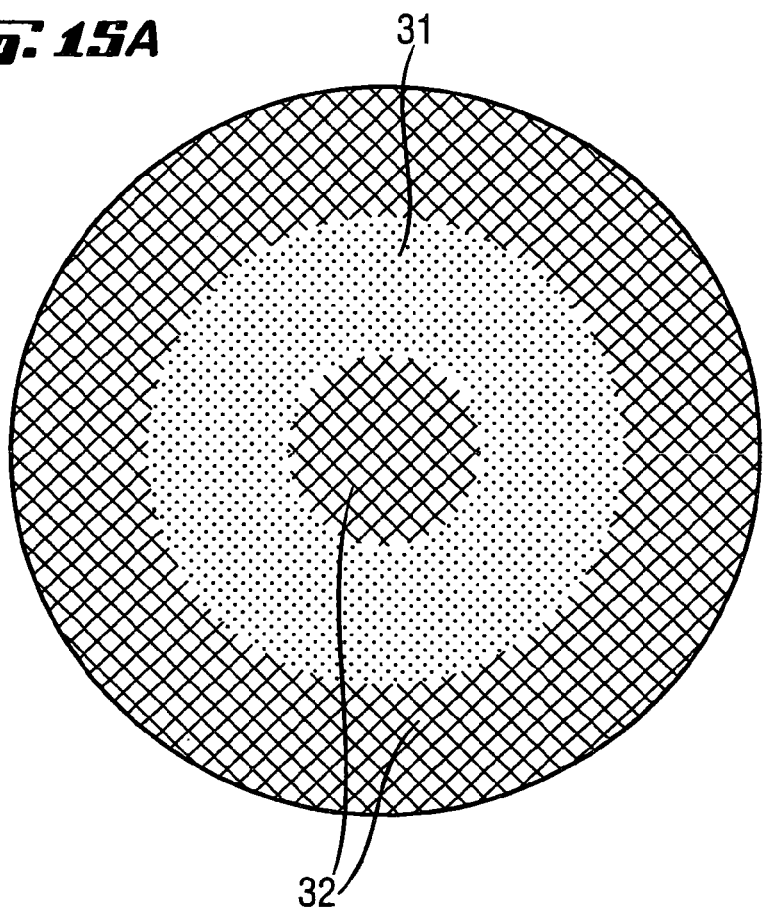

FIG. 15 illustrates the distribution determined with the aid of µPCD measurements for an axial crystal section. The single crystal was pulled with an increasing pull rate. The radial region which appears to be structureless due to the reduced oxygen precipitation characterizes the region where interstitial silicon atoms dominate, while vacancy defects are predominant in the other regions. As the pull rate increases, transition is observed from agglomerated interstitial atoms, the LPITs 30, through unagglomerated interstitial atoms 31 to the unagglomerated vacancies 32. A silicon wafer taken from the single crystal at the section position A can therefore have radial regions of vacancies 32 as represented in FIG. 15, even at the wafer edge. For oxygen contents of more than about $5*10^{17}$ 1/cm$^3$, the resulting sequence of regions can likewise be determined accurately with the aid of the oxygen-induced stacking faults. With the method according to the invention, the thermal conditions can be set up so that any desirable predetermined radial defect distribution is possible.

The distribution of the agglomerated self-point defects (COPs or LPITs) was analyzed by the conventional method by means of Secco etching (21 minutes at 30° C.) on ground, smoothly etched test wafers using a light microscope. The conventional light-scattering methods were also employed on polished wafers (SP1), so that larger COPs with a diameter of more than 90 nm could be detected. In order to detect smaller COPs, these were enlarged to the measurability range before the light scattering measurement by means of a standard etching method, an SC1 treatment (3 hours in hydrogen peroxide and aqueous ammonia), or a gate oxide integrity test (GOI test) was carried out. Detailed size analyses of the agglomerated self-point defects were carried out by means of transmission electron microscopy studies (TEM). The measurement methods have already been described many times and at length in the literature, for example in H. Bender, J. Vanhellemont, R. Schmolke, "High Resolution Structure Imaging of Octahedral Void Defects in As-grown Czochralski Silicon", Japan J. Appl. Phys. 36 (1997), L 1217-L 1220, Part 2, No. 9A/B. The examples presented below relate to primarily (100)-oriented single crystals with a diameter of 300 mm. The results are, however, readily applicable to other orientations, for example (110) or (113), and larger diameters.

EXAMPLE 1

A silicon single crystal was produced, from which semiconductor wafers with the following properties could be separated:

With respect to agglomerated self-point defects, the single crystals with a diameter of 300 mm had only agglomerated vacancy defects (COPs), these defects having an average diameter of less than 50 nm and being covered with an oxide layer, the thickness of which was less than 1 nm. The thickness of the oxide layer was usually more than 2 nm.

Figure 16:
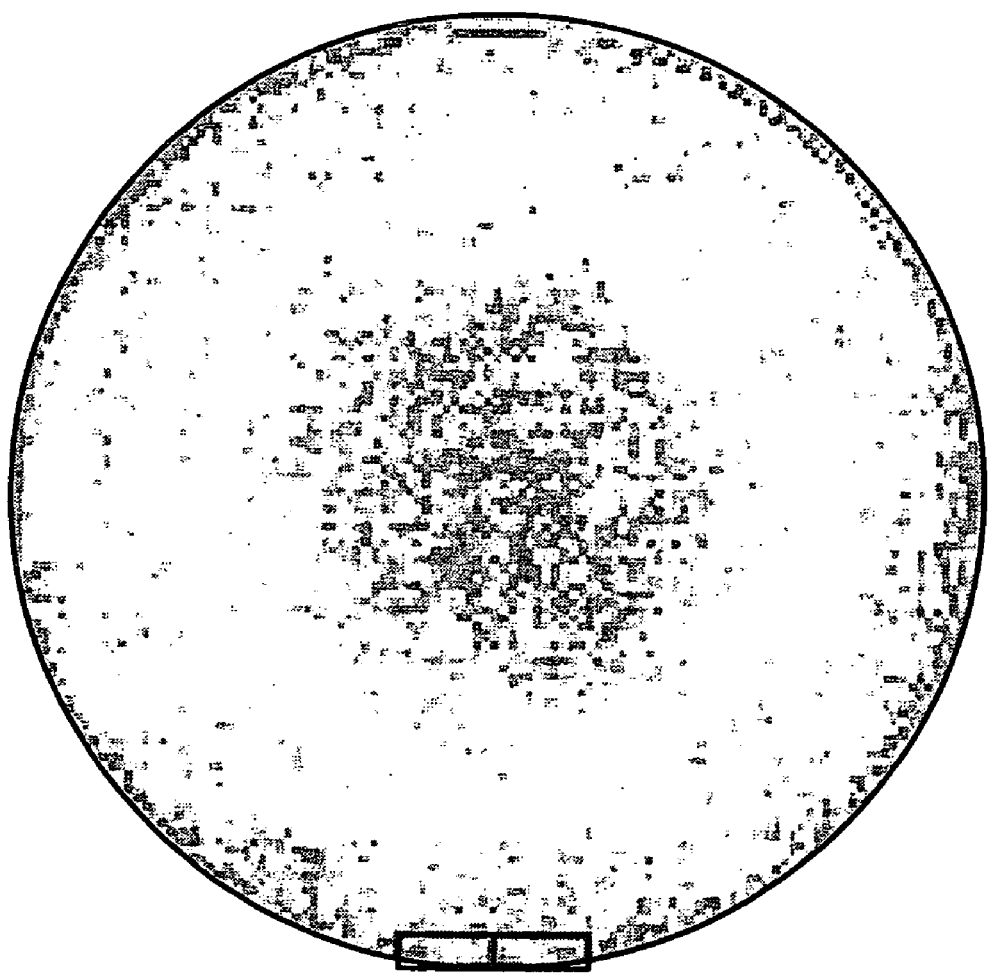

FIG. 16 shows such a polished and SC1-treated 300 mm silicon wafer, which was examined for small vacancy agglomerates with a diameter of less than 50 nm (small COPs) by means of laser scattering methods. The defect distribution was also confirmed by measurements on axial crystal sections and by GOI studies.

The particular advantage of such semiconductor wafers is that the defects (small COPs) do not cause problems in the fabrication of electronic components because, due to the small size of the agglomerates and the small thickness of the oxide layer, they can be erased by a heat treatment, at least in the regions where the components are integrated. The heat treatment need not necessarily be carried out separately, since the semiconductor wafers are in any case exposed to the requisite temperatures of at least 1000° C. at the start of component fabrication.

The process parameters employed are generally derived from the following formula, which gives the size distribution of the COPs.

$$V_{COPs} \propto \left[ \frac{1}{q} \cdot \left(1 - \frac{C_{crit}}{(V/G)}\right) \right]^{\frac{3}{2}}$$

The size distribution of the COPs is given by the volume $V_{COPs}$.

q is the cooling rate of the crystal at the solidification front in the temperature range of from 1100° C. to about 1000° C. As described above, the defect function V/G® characterizes the crystallization process in respect of the defects which occur, the critical limit being $C_{crit}=1.3*10^{-3}$ cm$^2$ min$^{-1}$ K$^{-1}$.

After the typical proportionality factor has been determined for a crystallization process, the size distribution of the COPs can therefore be adjusted by means of V/G and the cooling rate.

For the example in question, a cooling rate in the temperature range of from 1000° C. to 950° C. was determined at about 0.8° C./min from associated model simulation calculations. To this end, with a cylindrical crystal position of 50 cm, a ratio of the crucible rotation to the crystal rotation of 1:2 was used, together with a heat supply from the main heater 4, the bottom heater 8 and the ring heater 19 in the ratio of about 1:0.3:0.2. The ratio V/G was up to 10% more than $C_{crit}$.

EXAMPLE 2

A silicon single crystal was produced, from which semiconductor wafers with the following properties could be separated:

The semiconductor wafers were free of agglomerated self-point defects and two or more mutually separated axially symmetric regions, in which unagglomerated vacancies dominate as the defect type. The semiconductor wafers therefore have the properties of a silicon wafer corresponding to the section A in FIG. 15. The particular advantage of producing such semiconductor wafers is that the process management during the production of the single crystal is simplified, because less outlay is required on control technology. This is because there is a particularly wide process window in respect of the allowed variation of V/G. In the case of such semiconductor wafers, the oxygen precipitation occurring in the vacancy region can furthermore be adjusted accurately to the requirements of the component fabrication.

In this example, at the section position which was about 30 cm along the cylindrical crystal length, a ratio of the crucible rotation to the crystal rotation of 1:2.4 was used, together with a heat supply from the main heater 4, the bottom heater 8 and the ring heater 19 in the ratio 1:0.3:0.24. The ratio V/G was close to $C_{crit}$.

EXAMPLE 3

This example relates to semiconductor wafers with a defect distribution similar to that of the semiconductor wafers in Example 2, with the difference that unagglomerated interstitial silicon atoms dominate as the defect type in the two or more mutually separated axially symmetric regions. The process management during the production of the single crystal is simplified in the case of such semiconductor wafers as well, for the reasons mentioned above.

Figure 17:
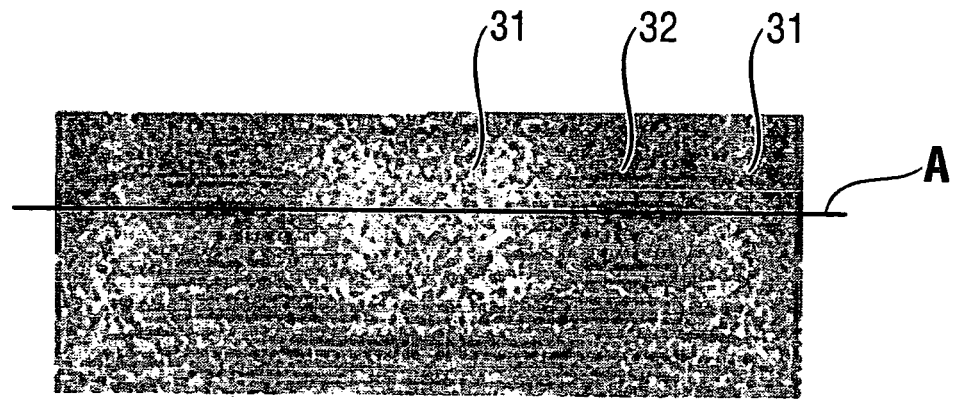
Figure 17A:
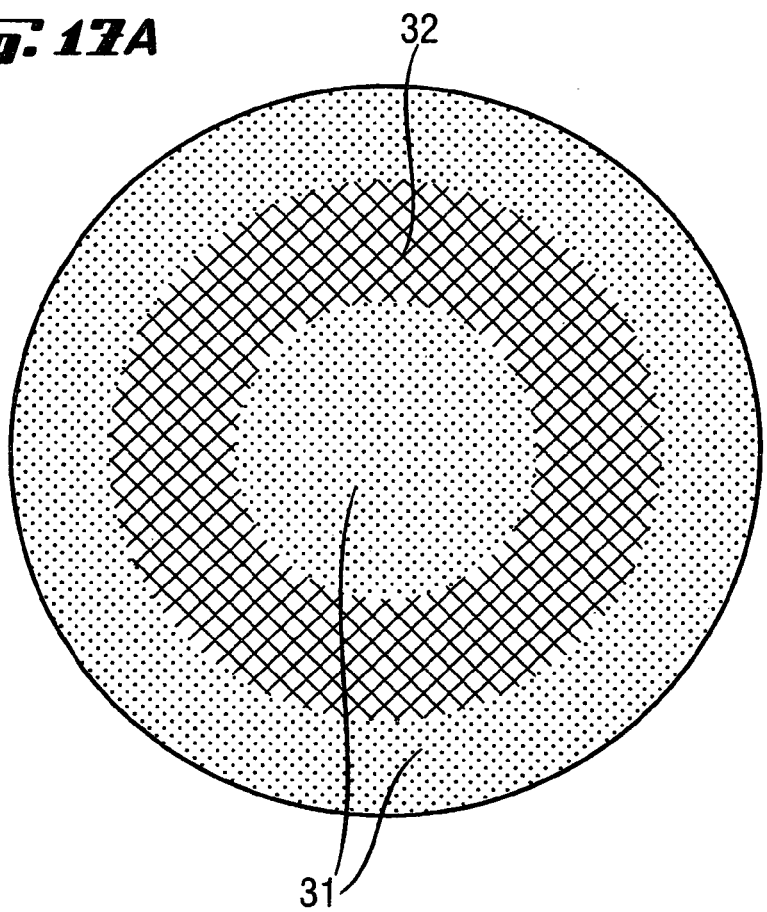

This distribution is illustrated in FIG. 17. The deliberate control of the heat distribution at the solidification front even makes it possible for a region 31 dominated by interstitial atoms to be produced at the center, or to be alternate with a vacancy-rich annular region 32 in a radial sequence.

The described distribution was achieved by a stronger heat supply at the center of the solidification front. To this end, the required heat flux was produced for each crystal position by means of the heating powers, the crystal displacement and the crucible and crystal rotations, together with the process pressure and the argon flow.

In this example, at the section position which was about 45 cm along the cylindrical crystal length, a ratio of the crucible rotation to the crystal rotation of 1:2.1 was used, together with a heat supply from the main heater 4, the bottom heater 8 and the ring heater 19 in the ratio 1:0.4:0.24. The ratio V/G was close to $C_{crit}$ in this case as well.

With the aid of the proposed invention, it is moreover possible to obtain semiconductor wafers in which agglomerates of interstitial atoms (LPITs) occur as the defect type in regions with dominance of the interstitial atoms, although their size is so small that no secondary dislocations leading to A swirls are formed.

An example of this involves silicon semiconductor wafers with agglomerated interstitial atoms (LPITs) as the defect type, although their size is so small that there are still no secondary dislocations.

Another example involves silicon semiconductor wafers having at least one region with agglomerated vacancy defects (COPs) as the defect type, these defects having an average diameter of less than 50 nm and being covered with an oxide layer whose thickness is less than 1 nm, and at least one region with agglomerated interstitial atoms (LPITs) as the defect type, although their size is so small that there are still no secondary dislocations.

Accordingly, while only a few embodiments of the present invention have been shown and described, it is obvious that many changes and modifications may be made thereunto without departing from the spirit and scope of the invention.

What is claimed is:

1. A method for the production of a silicon single crystal comprising
   pulling the single crystal, according to the Czochralski method, from a melt which is held in a rotating crucible, the single crystal growing at a growth front having a center region and an edge region;
   iso-rotating the single crystal and the crucible;
   providing a heat source arrayed at the center of the bottom of the crucible;
   supplying heat to the center of the growth front by the heat source acting on the center of the growth front, so that per unit time, more heat reaches the center region of the growth front than the edge region of the growth front surrounding the center region.

2. The method of claim 1, wherein a curvature of the growth front is reduced or increased.

3. The method of claim 1, wherein an axial temperature gradient G(r) at the growth front is regulated, r extending from 0 as far as a radius of the growing single crystal.

4. The method of claim 1, wherein a temperature distribution, in which a radial variation of a temperature gradient G(r) in the melt is less than 15%, is produced in a region with an extent of up to 5 cm below the growth front and at least 90% of a diameter of the single crystal.

5. The method of claim 1, wherein a heat flux is produced by the heat source, which increases the temperature at a center of a bottom of the crucible compared with the temperature at an edge of the bottom of the crucible.

6. The method of claim 1, wherein a bottom heater is arranged below the crucible, further comprising thermally insulating a peripheral portion of the bottom of the crucible such that the bottom heater heats the center of the bottom of the crucible more strongly than a periphery of the bottom of the crucible.

7. The method of claim 1, wherein the temperature of the crucible at the center of the bottom of the crucible is increased by at least 2 K relative to the temperature at the edge of the bottom of the crucible.

8. The method of claim 1, wherein the rotational speed of the crucible is at least 10% of a rotational speed of the single crystal.

9. The method of claim 1, wherein the melt is exposed to a CUSP magnetic field.

10. The method of claim 1, wherein the melt is exposed to a traveling magnetic field.

11. The method of claim 1, wherein a heat flux is produced by an electromagnetic field to which the melt is exposed, at least 10% of a wall area of the crucible being shielded against an effect of the electromagnetic field on the melt.

12. The method of claim 11, wherein the heat flux is produced by a traveling magnetic field.

13. The method of claim 12, wherein a rotational symmetry of the electromagnetic field is broken by a partial shielding of the field.

14. The method of claim 1, wherein a heat flux is produced by applying a positive electrical voltage of more than 100 volts to the crucible.

15. The method of claim 1, wherein additional heat is supplied to a phase boundary of the single crystal, to the atmosphere surrounding the phase boundary and to the melt, by a heating element positioned above the melt and around the crystal.

16. The method of claim 1, wherein the growing single crystal is cooled by a cooling device.

17. The method of claim 1, wherein a fluctuation of a pull rate when pulling a silicon single crystal with a diameter of at least 200 mm, with a pull rate at which neither defects due to agglomerated vacancies nor defects due to agglomerated interstitial atoms are created, is at least ±0.02 mm/min while the single crystal is being pulled over a length of at least 30 mm.

18. A device for the production of a single crystal according to the Czochralski method, comprising:
  a crucible which contains a melt;
  a heating device surrounding the crucible;
  a magnetic instrument surrounding the crucible and producing a static or dynamic magnetic field;
  a heat source within the device arranged above the melt and supplying heat to the phase boundary of the single crystal, to the gas phase and to the melt;
  a cooling device surrounding the single crystal;
  a heat shield surrounding the single crystal;
  a control unit which causes iso-rotation of the single crystal and the crucible; and
  a heat source which is arranged at the center of the bottom of the crucible and acts on a center of the growth front of a crystal being produced in said crucible, the growth front having a center region and a peripheral region surrounding the center region so that per unit time, more heat reaches the center region of the growth front than the peripheral region of the growth front.

* * * * *